United States Patent
Carillo, Jr. et al.

(10) Patent No.: US 6,603,981 B1
(45) Date of Patent: Aug. 5, 2003

(54) DEVICE FOR RADIATION SHIELDING OF WIRELESS TRANSMIT/RECEIVE ELECTRONIC EQUIPMENT SUCH AS CELLULAR TELEPHONE FROM CLOSE PROXIMITY DIRECT LINE-OF-SIGHT ELECTROMAGNETIC FIELDS

(76) Inventors: Juan C. Carillo, Jr., 4036 W. 184 St., Torrance, CA (US) 90504; James S. Carillo, 4036 W. 184 St., Torrance, CA (US) 90504

( * ) Notice: Subject to any disclaimer, the term of this patent is extended or adjusted under 35 U.S.C. 154(b) by 0 days.

(21) Appl. No.: 09/348,144

(22) Filed: Jul. 6, 1999

(51) Int. Cl.$^7$ ............................ H04B 1/38; H04M 1/00
(52) U.S. Cl. ..................... 455/550; 455/90; 455/128
(58) Field of Search .................... 455/90, 128, 129, 455/117, 575, 351, 300, 550; 379/437, 451, 428, 430, 433, 449, 452, 440; 343/841, 702, 718; 250/515.1; 174/35 R; 2/171

(56) References Cited

U.S. PATENT DOCUMENTS

| | | | |
|---|---|---|---|
| 5,335,366 A | 8/1994 | Daniels | 455/89 |
| 5,338,896 A | 8/1994 | Danforth | 174/35 |
| 5,367,309 A | 11/1994 | Tashjian | 343/702 |
| 5,444,866 A | 8/1995 | Cykiert | 455/89 |
| 5,535,439 A | 7/1996 | Katz | 455/117 |
| 5,564,085 A | 10/1996 | Chen et al. | 455/117 |
| 5,570,476 A * | 11/1996 | Olive | 2/200.1 |
| 5,613,221 A | 3/1997 | Hunt | 455/89 |
| 5,731,964 A | 3/1998 | Kitakubo et al. | 361/816 |

* cited by examiner

*Primary Examiner*—Nguyen T. Vo
(74) *Attorney, Agent, or Firm*—Charles C. H. Wu; Wu & Cheung, LLP

(57) ABSTRACT

A device for locally shielding or blocking a user from close proximity electromagnetic fields emitted by a wireless transmit/receive electronic equipment antenna 22 such as a cellular telephone. The device includes a wearable garments such as a baseball cap 10, electronic carrying pouch 110, fan 210, 250, 410, eyeglass 610, or screens, joined with having EMI/RFI material properties that is specifically worn by the user or placed between the user and the electromagnetic field emanating wireless antenna source 22. It serves to provide as a electromagnetic field shield, either reflective, absorptive, or dissipative behavior in nature, from an direct line-of-sight electromagnetic field radiating from a wireless device antenna 22. The effective shielding area is determined by the shielding device dimensions, the direct line-of-sight electromagnetic field signal antenna transmission behavior and the placement of the shielding device located between the user local human body sensitive tissue area and the wireless transmit/receive electronic equipment antenna 22, as solutions for opened-form design method shielding which serves to minimize the shielding degradation effects and sensitivity interaction effects on normal non-blocked electromagnetic fields antenna signal transmission operation.

2 Claims, 9 Drawing Sheets

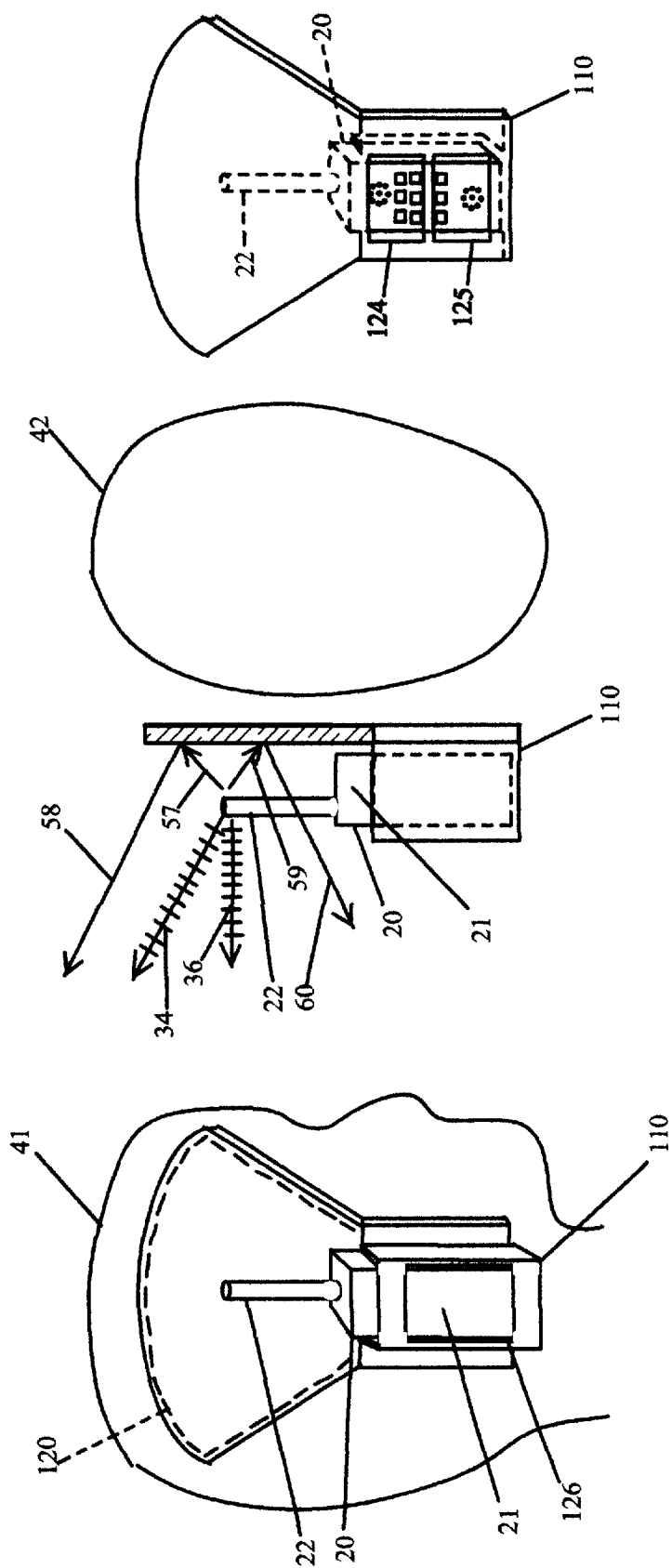

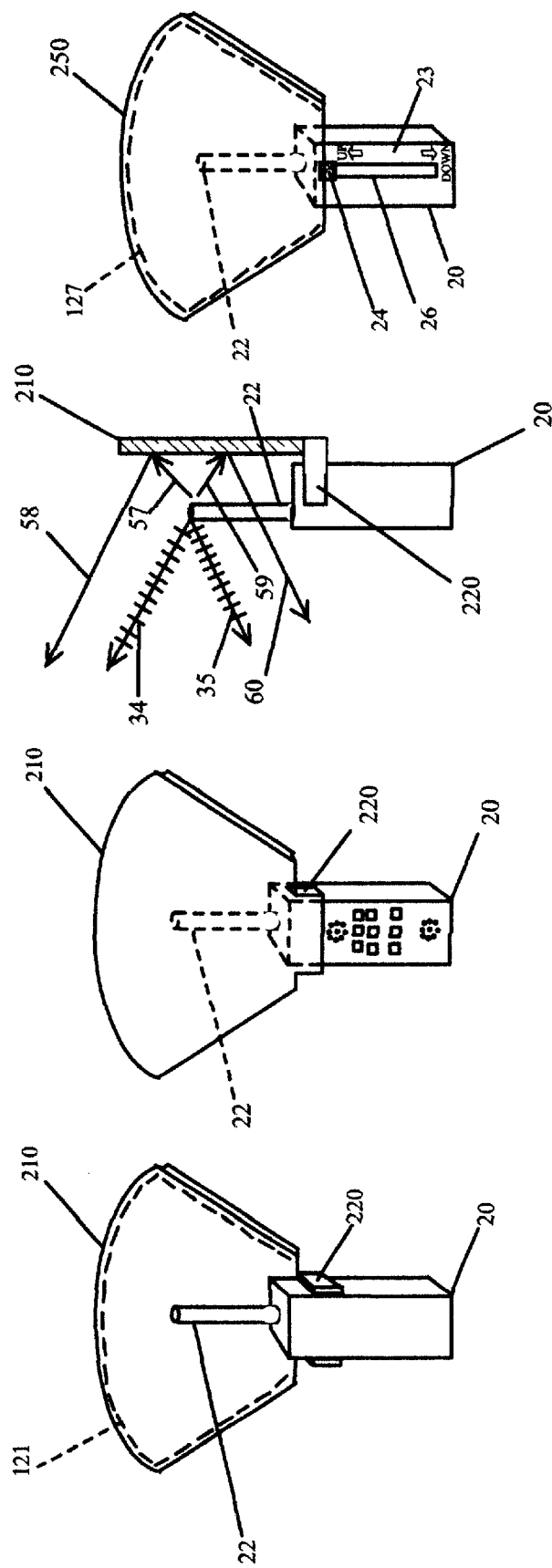

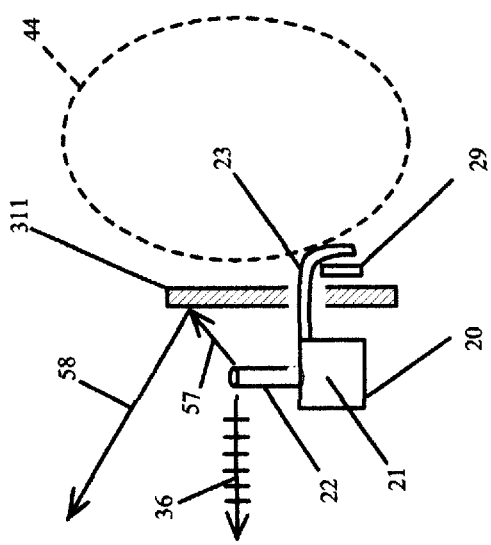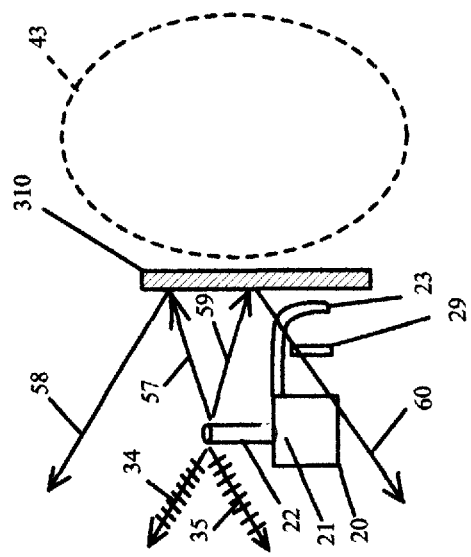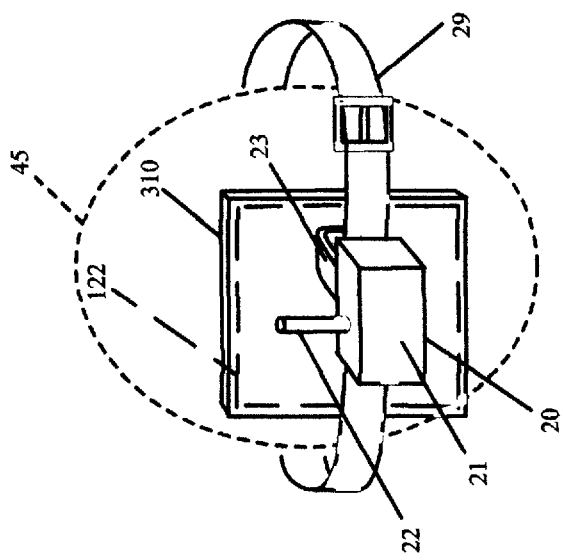

DEVICE FOR RADIATION SHIELDING OF WIRELESS TRANSMIT/RECEIVE ELECTRONIC EQUIPMENT SUCH AS CELLULAR TELEPHONE FROM CLOSE PROXIMITY DIRECT LINE-OF-SIGHT ELECTROMAGNETIC FIELDS

BACKGROUND OF THE INVENTION

1. Field of the Invention

This invention relates generally to shielding electromagnetic interference/radio frequency interference (EMI/RFI) fields and, more particularly, to shielding sensitive local human body tissue parts from potential harmful electromagnetic fields emanating from close proximity direct line-of-sight wireless transmit/receive electronic equipment antenna source.

2. Discussion of Related Art

There is much concern throughout the world that electromagnetic field radiation and microwave radiation may cause human body tissue damage. The antenna and the body of wireless transmit/receive electronic equipment such as a cellular telephone and higher frequency band transceivers come in close contact with a person head or sensitive human body tissue part thereby creating a close exposure to electromagnetic field and microwave radiation. Because of these hazards and to offer some protection against these hazards, some form of shielding devices were invented. Current state-of-the-art provide accessories for cellular telephones or higher frequency band transceivers that will afford some protection to cellular telephone and higher frequency band transceiver users from the alleged brain, head and sensitive body tissue damage caused by electromagnetic field radiation of cellular telephone or higher frequency band transceiver use. These accessories are primarily of closed-form design solutions around the electronic equipment to reduce electromagnetic field radiation emanating from the electronic equipment body, but does not attempt to sufficiently reduce electromagnetic field radiation from the antenna, regarding direct line-of-sight signal transmission between the antenna and the sensitive human body tissue part without causing serious impact to normal signal transmission operation.

Some attempts to implement closed-form method shielding design solutions around electromagnetic field radiation from an electronic equipment antenna would be very difficult to implement without causing tremendous antenna transmit/receive signal degradation for the equipment and still be effective in providing sufficiently adequate shielding for the user. Strict and exacting design parameters and controls over time of equipment operation on shield spacings, positioning, shield part dimensions and material electrical characteristic behavior parameters under normal stress movement conditions by the user, would be required to solve the complex and specific antenna electromagnetic field frequency response voltage standing wave ratio loading and matching criteria relative to that particular antenna electrical structure design in order for proper antenna operation.

Note that for added clarification regarding the concept of closed-form method design solutions, a simplified circuit model is shown in FIG. 10, that shows a comparison between the closed-form versus opened-form method design solutions as applied to close-proximity electromagnetic field radiation exposure to the user. Also note that the basic distinction for the closed-form method design solutions is for the shielding to encompass around the electronic equipment body or antenna as noted by the diagrammed reference node point to antenna. But with regards to the opened-form method design solution, is the shielding to encompass around the human body user part as noted by the diagrammed reference node point to user. Further note, if we were to start with the same finite small closed-form and opened-form surface shielding area and now increase each surface area evenly further, the closed-form shielding area encompasses and terminates more electromagnetic fields from the antenna thereby increasing the design sensitivities and interactions, whereas for the opened-form shielding area does not encompass or terminate electromagnetic fields appreciably to affect the antenna operation any further for matters that would be appreciated by those skilled in the art.

What is needed is an opened-form method design solution that is simply detached from the design requirement of solving for complex antenna matching criteria parameters and now centered the design solution around the exposed electronic user body part, serving means to provide an electromagnetic field radiation shielding or blockage, either reflective or absorptive or dissipative behavior in nature, in order to reduce the direct line-of-sight antenna electromagnetic field radiation to the sensitive human body tissue part without causing significant antenna signal transmit/receive degradation for proper wireless electronic equipment operation and simplifying the shielding device design, irrespective of any antenna strict electrical and structure matching criteria that would be imposed if one were to use parameters for closed-form method design solutions, thus simplifying the present invention fabrication, improving performance reliability and repeatability of the present invention.

SUMMARY OF THE INVENTION

In accordance with the teaching of the present invention, a shielding device using opened-form method design solutions around the electronic user body part, that will reduce potential harmful effects from the direct line-of-sight electromagnetic field radiation of an emanating antenna source of a wireless transmit/receive electronic equipment including such as and not limited to a cellular telephone is disclosed that employs the use of wearable garments including and not limited to a hat, eyewear articles, wearable wrap-around type articles, electronic equipment carrying pouch of upwardly fan structure arrangement, foldable or fixed fan structure arrangement, internally pop-up fan mechanism arrangement, screen structure arrangement, that resolves the problem of inadequate antenna electromagnetic field direct line-of-sight human body part shielding protection as stated in the prior art discussion.

The electromagnetic field radiation shielding device is comprised of a wearable garments including a hat, eyewear articles, wearable wrap-around type articles, electronic equipment carrying pouch of upwardly fan structure arrangement, foldable or fixed fan structure arrangement, internally pop-up fan mechanism arrangement, screen structure arrangement, that employs the use of EMI/RFI material properties which will provide shielding or blockage (either reflective or absorptive or dissipative behavior in nature or some interdependency combinations of said behavior group) of harmful direct line-of-sight electromagnetic field radiation from an emanating antenna wireless transmit/receive electronic equipment source. This device is placed in relatively close-proximity with or without contact to the sensitive human body tissue part and lies in the direct line-of-sight to the emanating antenna electromagnetic field radiation or propagation field path of travel. Additional objects, advantages, and features of the present invention will become apparent from the following description and appended claims, taken in conjunction with the accompanying drawings.

BRIEF DESCRIPTION OF THE DRAWINGS

FIG. 3 is a perspective view of such electronic equipment carrying pouch of extended upwardly fan structure arrangement device with having EMI/RFI material properties providing various applications to shielding sensitive human body tissue part, according to an embodiment of the present invention;

FIG. 4 is a perspective view of such foldable or fixed fan device structure arrangement with having EMI/RFI material properties providing various applications to shielding sensitive human body tissue part, according to an embodiment of the present invention;

FIG. 5 is a perspective view of such internally pop-up foldable fan device structure arrangement with having EMI/RFI material properties providing various applications to shielding sensitive human body tissue part, according to an embodiment of the present invention;

FIG. 6 is a perspective view of such sandwiched type screen device arrangement with having EMI/RFI material properties providing various applications to shielding a sensitive human body tissue part, according to an embodiment of the present invention;

DETAILED DESCRIPTION OF THE PREFERRED EMBODIMENTS

Figure 1:
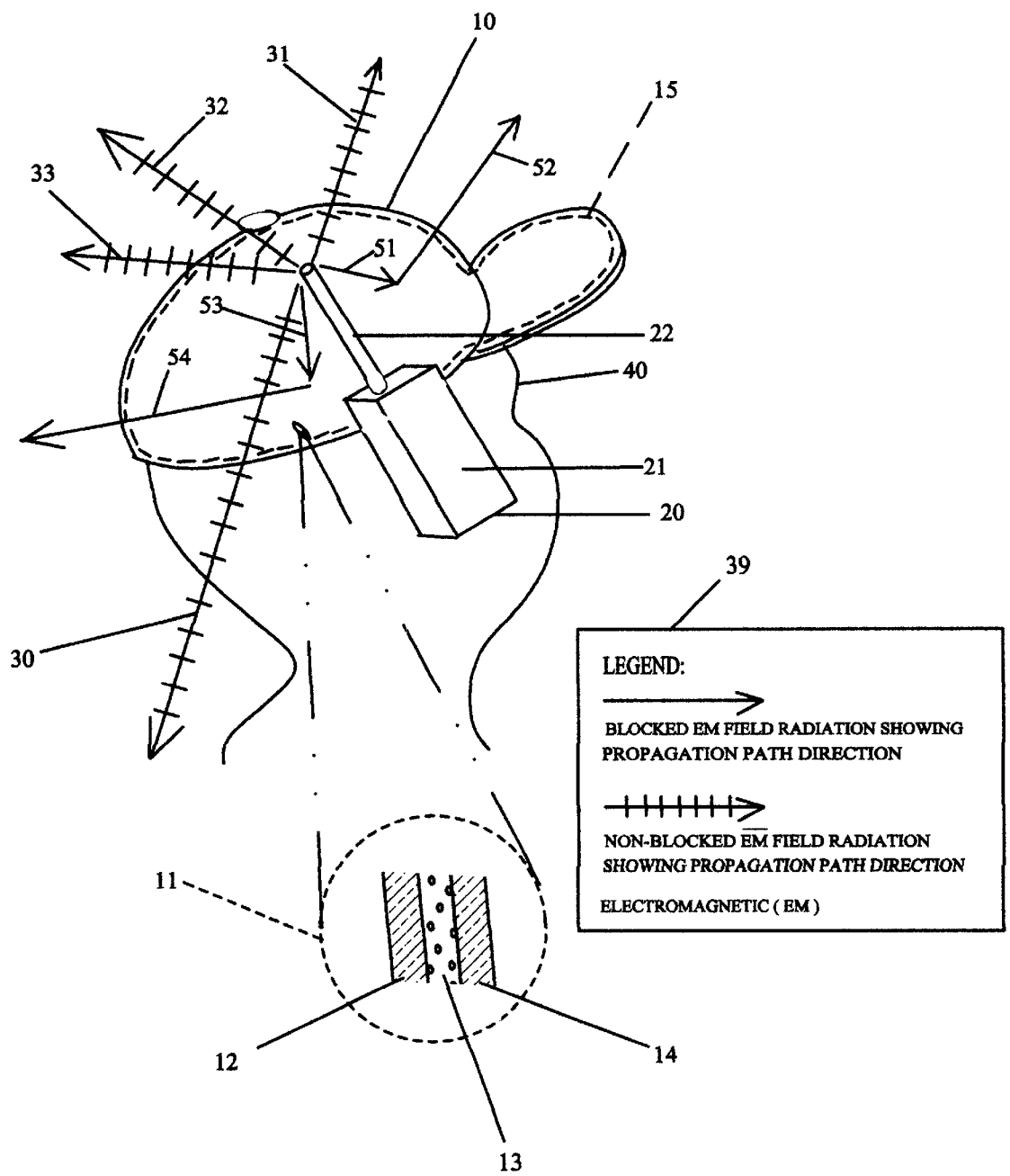
FIG. 1 is a perspective view of such wearable garment device such as a baseball cap with having EMI/RFI material properties, providing local area shielding or blockage from close-proximity wireless transmit/receive electronic equipment according to an embodiment of the present invention.

By way of opened-form method design solutions, the following discussion of the preferred embodiments directed to wearable garments including and not limited to a hat as a baseball cap, eyewear articles including and not limited to an eye-glass, electronic equipment carrying pouch of extended upwardly fan structure arrangement, foldable or fixed fan structure arrangement, internally pop-up fan mechanism arrangement, screen articles, wearable wrap-around type articles, where said items joined with having EMI/RFI material properties that is predeterminedly worn by the user or placed between the user and the electromagnetic field emanating wireless transmit/receive electronic equipment 20 as comprised of an electronic body 21 and antenna 22, serves to provide predetermined local human body tissue part area with electromagnetic field shielding or blockage, either reflective or absorptive or dissipative behavior in nature or some interdependency combinations of said behavior group, from exposure to direct line-of-sight electromagnetic field signal radiating from a wireless transmit/receive electronic equipment antenna 22 is merely exemplary in nature and is in no way intended to limit the invention or its applications or uses. It is further noted that in all following antenna 22 discussions, although the drawings shown are in external electronic body antenna structure design form representation, an internally embedded electronic body antenna structure design form in meaning is encompassed in this embodiment.

Referring to FIGS. 1 through 9 are perspective views of such wearable garment device types, electronic equipment carrying pouch of upwardly fan structure arrangement, fan structure arrangement, eyewear articles and screen article types, joined with having EMI/RFI material properties for which the invention is located between the sensitive human body tissue part area and the direct line-of-sight electromagnetic field radiation emanating from a wireless transmit/receive electronic equipment antenna 22. Electromagnetic field radiation emanating from a wireless transmit/receive electronic equipment antenna 22 when located in close-proximity to a user human body tissue part will propagate a portion of its energy through the human body tissue non-blocked. The nature of this invention provides the affected local human body tissue part area with predetermined electromagnetic field shielding or blockage effective area zone of protection from exposure to direct line-of-sight electromagnetic fields. These electromagnetic fields propagates in a path of travel that originates from an antenna 22 which emanates a composite of electromagnetic fields traveling in a radial isotropic direction and those of the direct line-of-sight electromagnetic fields towards the sensitive human body tissue part. A predetermined portion of the electromagnetic fields are then blocked by the invention shielding effective area zone and thereby leaving the outside region of the shielding effective area zone comprising the remaining non-blocked electromagnetic field radiation to be un-perturbed for normal equipment signal transmission operation.

In close-proximity electromagnetic field radiation exposure to the user, the invention variation of FIG. 1 is a perspective view of such wearable garment device type joined with having EMI/RFI material properties that is worn on the user head 40, in particular but not limited to any hat design, a baseball cap 10 design to provide local head shielding or blockage effective area 15 from exposure to direct line-of-sight electromagnetic field radiation 51, 53 emanating from a wireless transmit/receive electronic equipment antenna 22. In addition, in FIG. 2 the user may wear the baseball cap 10 design in a different orientation over the head that will provide various shielding coverage, local head blockage effective area 16 from exposure to direct line-of-sight electromagnetic field radiation 55 to the head with respect to the wireless transmit/receive electronic equipment antenna 22 position.

Figure 2:
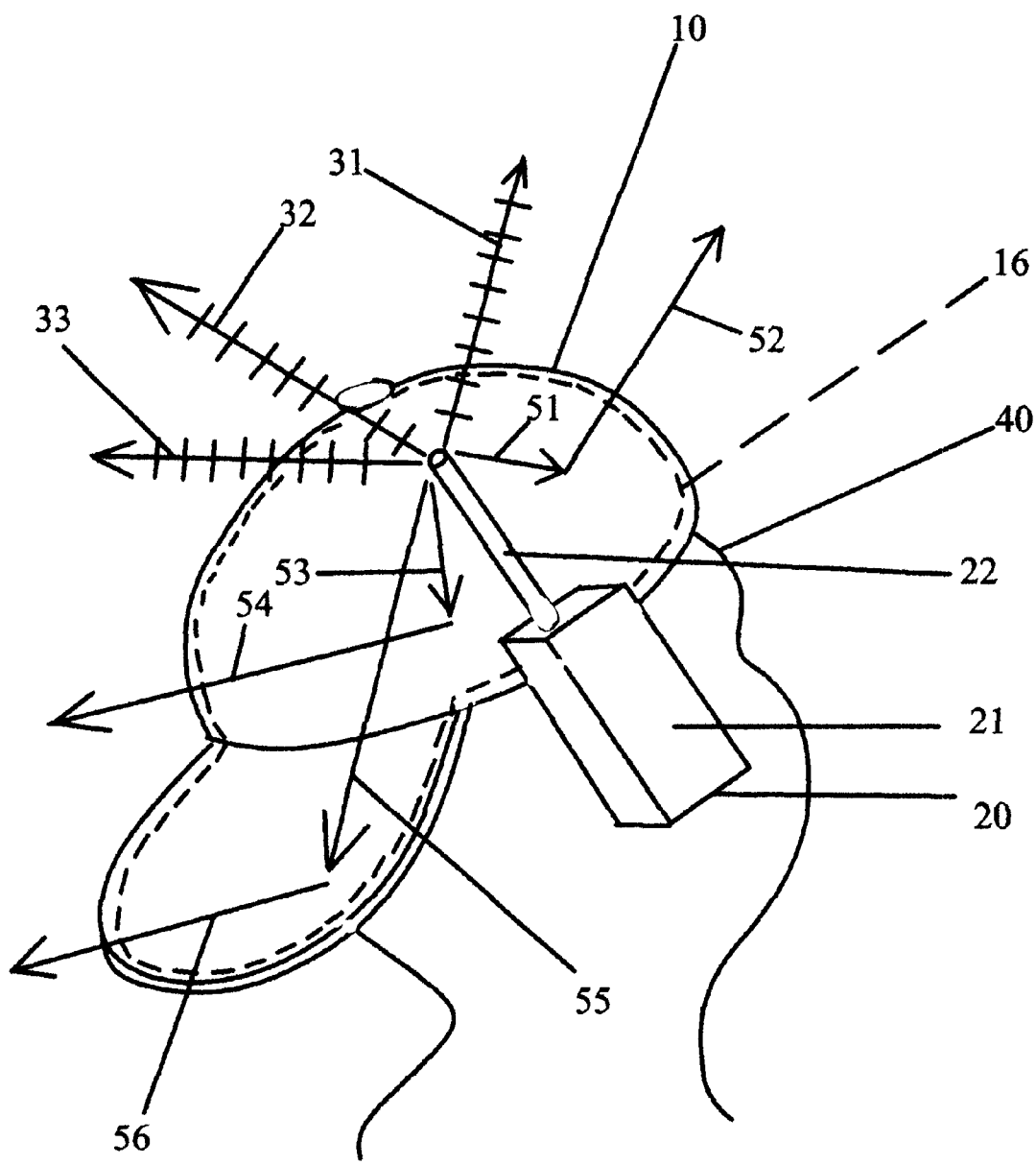
FIG. 2 is a perspective view of such wearable garment device in FIG. 1 depicting a modified implementation of the embodiment as worn differently by the user to provide a variation in shielding coverage area.

As shown in FIGS. 1 and 2 according to the invention, potential harmful direct line-of-sight electromagnetic field radiation 51, 53, 55 are shielded or blocked as reflective or absorptive or dissipative behavior in nature or some interdependency combination of said behavior group, from propagating through the invention and through the sensitive human body tissue part area directly behind or beneath the invention.

Note in general description applied to FIGS. 1 to 9, the diagrammed legend 39 describes a pictorial representation of the electromagnetic field radiation travel pattern as representative sample-point lines of directional travel path and are depicted as interconnecting lines with arrows for examples of deflected or blocked electromagnetic field radiation travel patterns 51 to 52, 53 to 54, 55 to 56, 57 to 58, 59 to 60, 61 to 62, 63 to 64, 65 to 66, 67 to 68 as influenced by the functional behavior of the invention local shielding effective area and the other lines with tick marks and arrows are shown for examples of non-blocked electromagnetic field radiation travel patterns 30, 31, 32, 33, 34, 35, 36, 37, 38 as is not designed to be shielded or blocked by the invention. With respect to FIGS. 1 and 2, examples of shielded or blocked electromagnetic fields 51 to 52, 53 to 54, 55 to 56 and non-blocked electromagnetic fields 30, 31, 32, 33 are shown to demonstrate the inventions shielding or blocking functional nature. Also note, in general, a typical wearable garment radiation shield material cross-sectional view 11 of the invention is shown, and is not limited in basic design form implementation to be employed with other wearable garments including and not limited to hats, electronic equipment carrying pouch of extended upwardly fan structure arrangement, foldable or fixed fan structure arrangement, internally pop-up fan mechanism arrangement, eyewear articles as an eye-glass, screens, blind-screen, wearable wrap-around type articles, is a baseball cap 10 device material cross-sectional perspective, joined with EMI/RFI material properties.

The general device material cross-sectional view 11 perspective of the invention joined with having EMI/RFI material properties layered together in a predetermined about or multitude of alternating sandwiched material layer fashion such as and not limited to: an outside EMI/RFI material layer 12 option, an optional cloth or other support material layer 13 and an inside EMI/RFI material layer 14 option.

Also note in FIGS. 1 and 2 that the head shielding effective area 15, 16 perspectively is designed to encompass around the user head 40 and not around the antenna 22, thus the invention design constituting an opened-form method design solutions.

In another example of close-proximity electromagnetic field radiation exposure to the user, the invention variation of FIG. 3 is a back, side and front perspective view of such electronic equipment carrying pouch of extended upwardly fan structure arrangement device 110 joined with having EMI/RFI material properties, with electronic equipment access window holes 124, 125, 126 as required, that is hand-held by the user, near the head 41, 42, perspectively. The wireless transmit/receive electronic equipment 20, in particular but not limited to a cellular telephone, a cellular telephone predeterminedly placed inside the electronic equipment carrying pouch of extended upwardly fan structure arrangement 110 to provide electromagnetic field local head shielding or blockage effective area 120 from exposure to direct line-of-sight electromagnetic field radiation 57 to 58, 59 to 60 emanating from a wireless transmit/receive electronic equipment antenna 22 position. The remaining non-blocked electromagnetic field radiation 34, 36 are left unperturbed by the invention design. Further note that the head shielding effective area 120 is designed to relatively encompass around the head 41,42 perspectively and not around the antenna 22, thus the invention design constituting an opened-form method design solutions.

Likewise, in another example of a close-proximity electromagnetic field radiation exposure to the user, the invention variation of FIG. 4 is a back, front and side perspective view of such foldable or fixed fan device structure arrangement 210, joined with having EMI/RFI material properties and said fan device structure arrangement 210 that implements a clipped-on or slip-fitted on attachment arrangement 220. The wireless transmit/receive electronic equipment 20, predeterminedly attached to the clipped-on or slip-fitted on attachment arrangement 220 will provide electromagnetic field local head blockage effective area 121 from exposure to direct line-of-sight electromagnetic field radiation 57 t 58, 59 to 60 emanating from a wireless transmit/receive electronic equipment antenna 22 position. The non-blocked electromagnetic field radiation 34, 35 are left un-perturbed by invention design. Or as shown in another variation of the invention, in FIG. 5 an internally pop-up fan mechanism arrangement 250 within the user wireless transmit/receive electronic equipment antenna body 23, comprising a slide position mechanism 24 within a slide assembly 26 and thereby mechanically supports the fan device pop-up mechanism structure arrangement 250 joined with EMI/RFI material properties. Again further note that the local head blockage effective area 121 and 127 respectively, is designed to relatively encompass around the user head and not around the antenna 22, thus the invention design constituting an opened-form method design solutions.

Continuing another example of a close-proximity electromagnetic field radiation exposure to the user, the invention variation of FIG. 6 is a front and side perspective view of such sandwiched type screen device arrangement 310 joined with EMI/RFI material properties, or modified slotted sandwiched type screen device arrangement 311 joined with EMI/RFI material properties, that is either slipped-in arrangement between the wireless transmit/receive electronic equipment 20, a belt arrangement 29 and the user body part 43, 45 perspectively for device arrangement 310, or is slip-fitted onto the wireless transmit/receive electronic equipment body hanger 23 which is then sandwiched closely against the user body 44 and hung in support by a belt arrangement 29 for device arrangement 311. Electromagnetic field user body part shielding or blockage effective area 122 is provided by either approach through sandwiched type screen device arrangement 310 or 311 from exposure to direct line-of-sight electromagnetic field radiation 57 to 58, 59 to 60 emanating from a wireless transmit/receive electronic equipment antenna 22 position. The non-blocked electromagnetic field radiation 34,35, 36 perspectively, are left un-perturbed by the invention design. Note that the user body part shielding effective area 122 is designed to relatively encompass around the user body part 43, 44, 45 perspectively and not around the antenna 22, thus the invention design constituting an opened-form method design solutions.

Figure 7A:
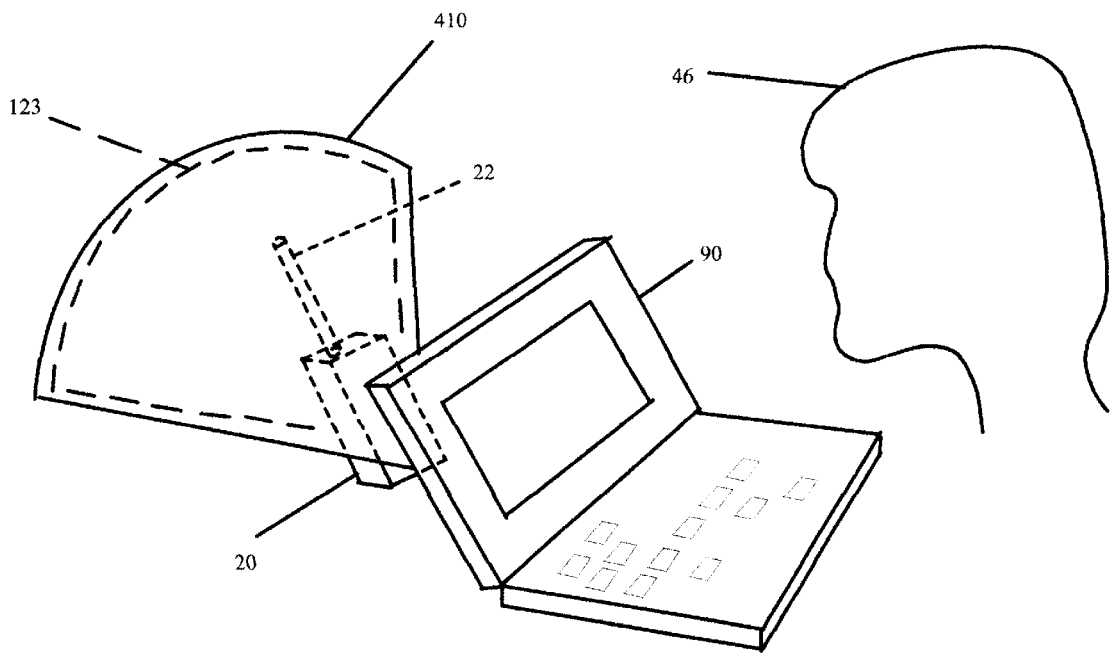
FIG. 7 is a perspective view in variation of such sandwiched type screen device similar to FIG. 6 as located differently with the wireless transmit/receive electronic equipment by the user to provide a variation in shielding area according to an embodiment of the present invention.
Figure 7B:
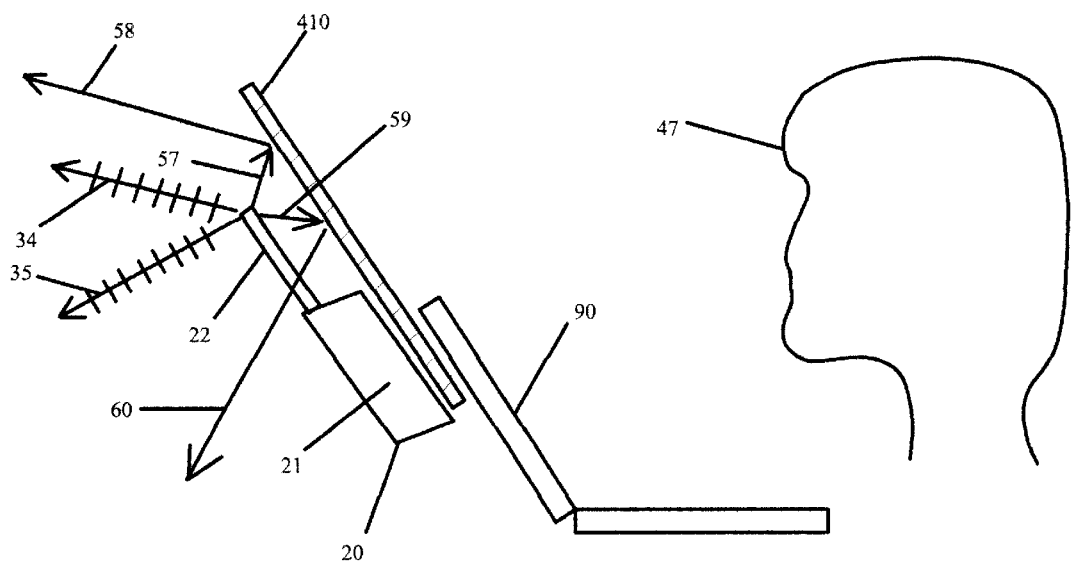

In contrast, note that preceding invention variations discussions were examples of close-proximity electromagnetic field radiation exposure to the user. But for FIG. 7, this invention variation applies to relative far-field proximity electromagnetic field radiation exposure to the user in providing effective shielding. This invention variation of FIG. 7 is a front and side perspective view of such variation of sandwiched type screen device 410 joined with EMI/RFI material properties that is slipped-in arrangement between the wireless transmit/receive electronic equipment antenna 22 and computer device 90 in direct line-of-sight of the human body head sensitive tissue part 46, 47, perspectively. The sandwiched type screen device 410 is predeterminedly placed between the wireless transmit/receive electronic equipment 20, in particular but not limited to a cellular telephone, the back or front side view of the computer device 90, as to provide electromagnetic field local head shielding or blockage effective area 123 from exposure to direct line-of-sight electromagnetic field radiation 57 to 58, 59 to 60, emanating from a wireless transmit/receive electronic equipment antenna 22 position. The non-blocked electromagnetic field radiation 34, 35 are left un-perturbed by the invention design. Note that the local head shielding effective area 123 is designed to relatively encompass around the user head 46, 47 perspectively and not around the antenna 22, thus the invention design constituting an opened-form method design solutions.

Figure 8:
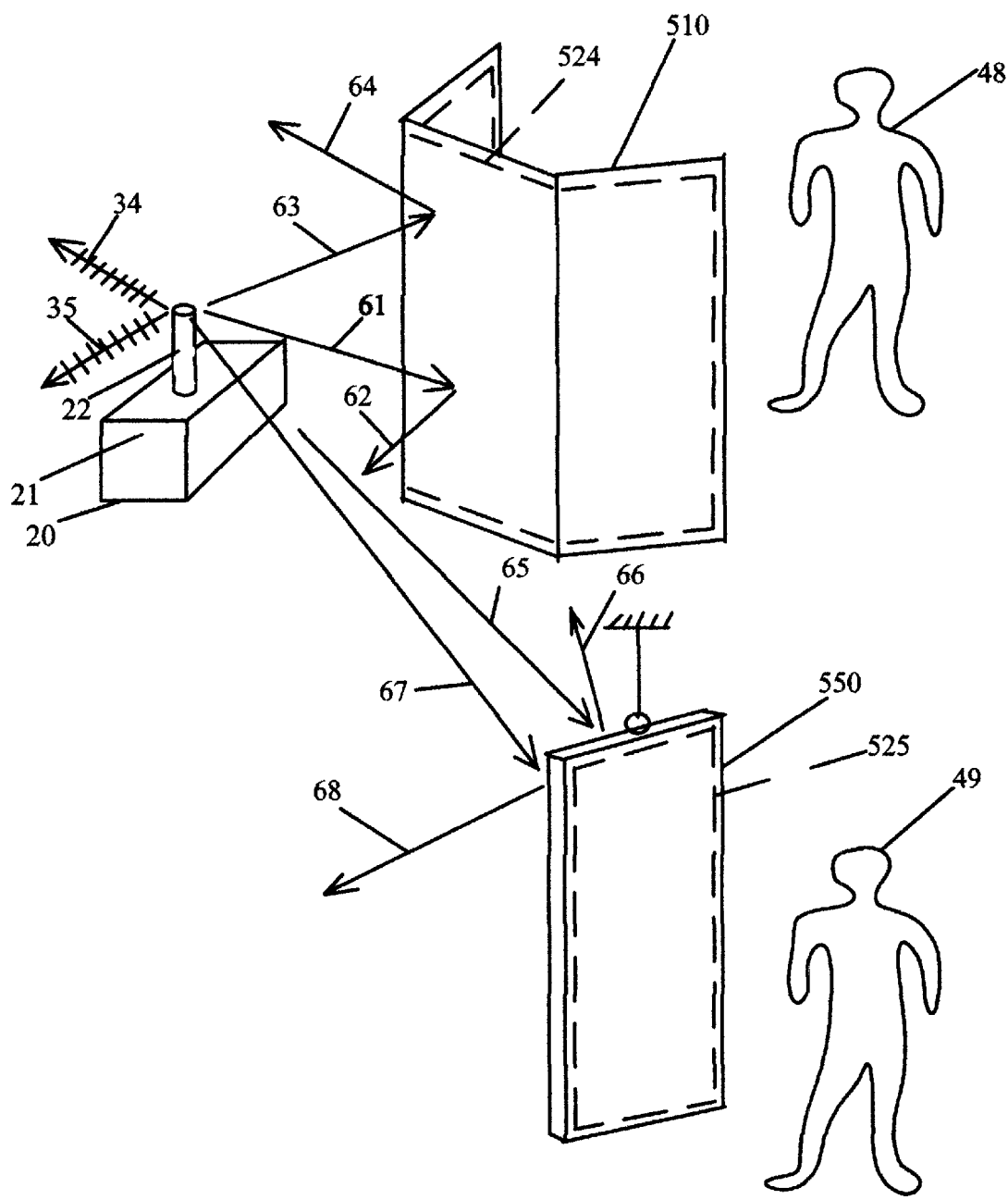
FIG. 8 is a perspective view of such screen or blind-screen device with having EMI/RFI material properties providing various applications to shielding sensitive human body tissue part, according to an embodiment of the present invention.

For another invention variation in far-field proximity electromagnetic field radiation exposure to the user as shown in FIG. 8 is a perspective view of such screen or blind-screen device joined with EMI/RFI material properties of predetermined size that is either free-standing screen 510 or suspended screen 550 from a support structure and is predeterminedly placed between the wireless transmit/receive electronic equipment antenna 22 and the user human body 48, 49, perspectively. Shielding is provided by the electromagnetic field shielding effective area 524, 525 perspectively, for the human body from exposure to direct line-of-sight electromagnetic field radiation 61 to 62, 63 to 64 and 65 to 66, 67 to 68 perspectively emanating from a wireless transmit/receive electronic equipment antenna 22 position. The non-blocked electromagnetic field radiation 34, 35 are left un-perturbed by the invention design. Note that the user body shielding effective area 524, 525 perspectively is designed to relatively encompass around the user body 48, 49 perspectively and not around the antenna 22, thus the invention design constituting an opened-form method design solutions.

Figure 9A:
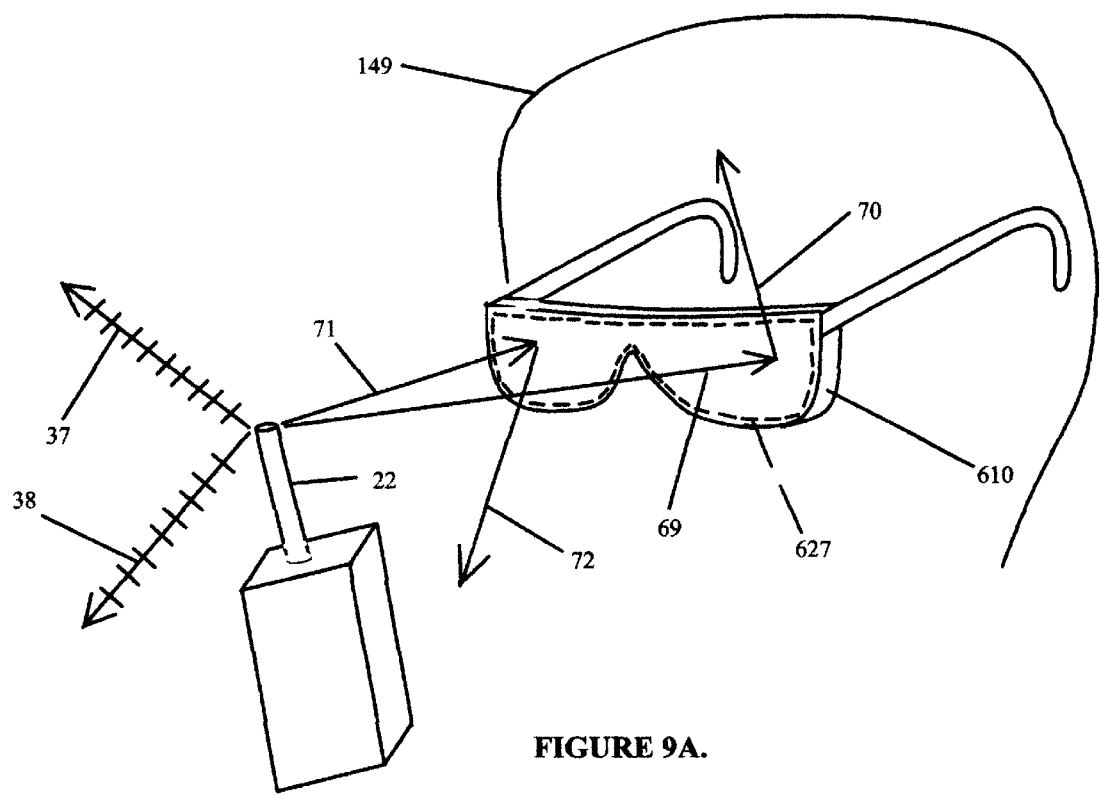
FIG. 9 is a perspective view of such eye-glass device with having EMI/RFI material properties providing various applications to shielding sensitive human body tissue part, according to an embodiment of the present invention.
Figure 9B:
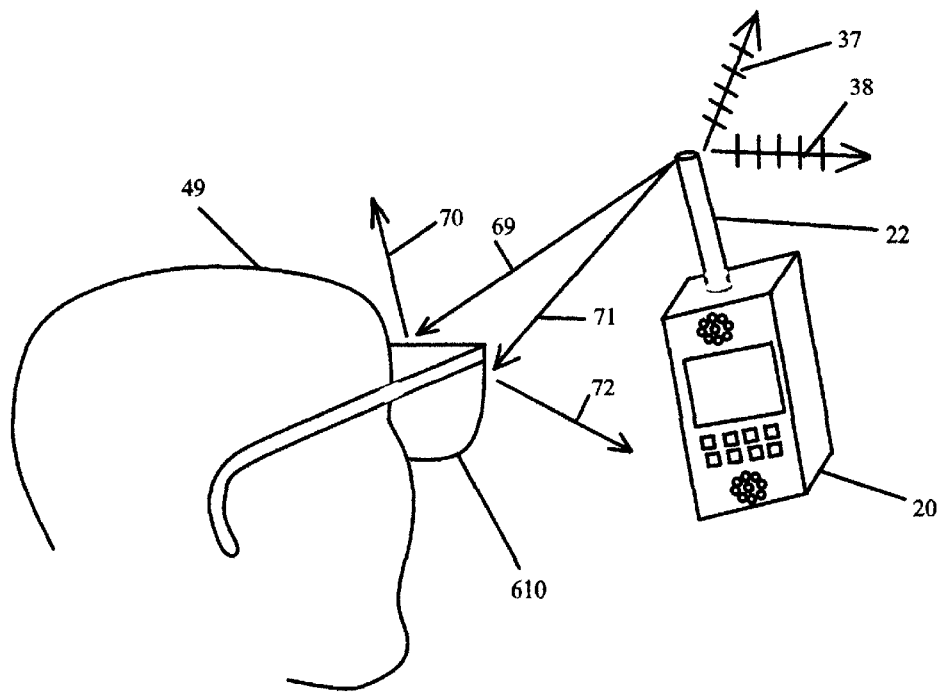
Figure 10B:
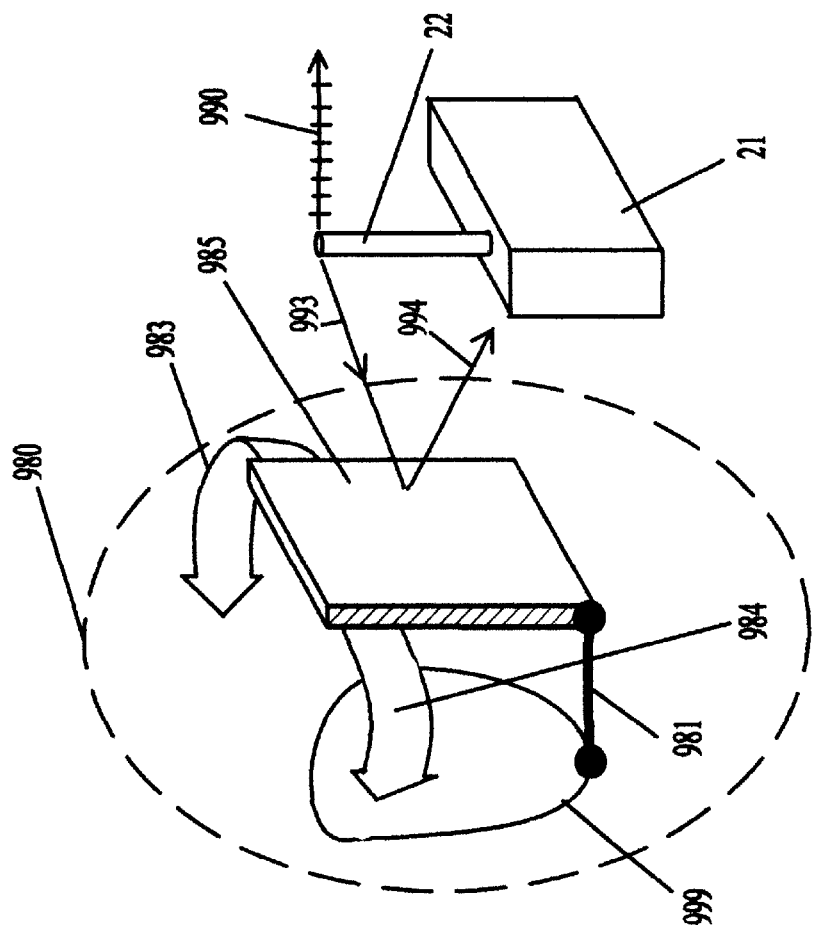
FIG. 10 is a simplified circuit model comparison between a closed-form versus opened-form method design solutions as applied to close-proximity electromagnetic field radiation exposure to the user.
Figure 10A:
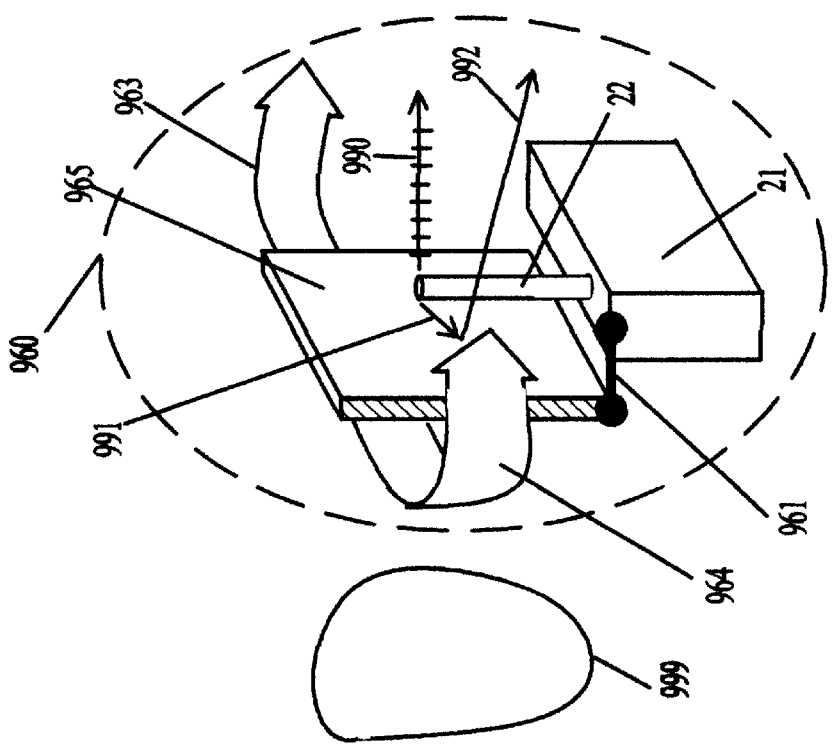

In another example of far-field proximity electromagnetic field radiation exposure to the user, the invention variation of FIG. 9 is a front and back perspective view of such eye-glass device 610 joined with having EMI/RFI material properties that is permanently or non-permanently attached that will provide local eye shielding or blockage effective area 627 from exposure to direct line-of-sight electromagnetic field radiation 69 to 70, 71 to 72 emanating from a wireless transmit/receive electronic equipment antenna 22. The non-blocked electromagnetic field radiation 37, 38 are left un-perturbed by the invention design. The wireless transmit/receive electronic equipment in this case and not limited to function, may represent visual information content, such that the user human body head 49, 149 shown perspectively may expose sensitive human body tissue eye part to potential harmful direct line-of-sight electromagnetic fields. Note that the local eye shielding effective area 627 is designed to relatively encompass around the human body head 49, 149 perspectively and not around the antenna 22, thus the invention design constituting an opened-form method design solutions. "A method of radiation shielding device rating in terms of shielding or blockage effectiveness in reducing the energy of radiated electromagnetic fields is referred to as radiation blockage factor (RBF) having to encompass teachings of the method by which RBF may be estimated is in modifying the transmission line method and circuit method (IEEE, 1988, "Special issue on electromagnetic shielding", IEEE Transactions on EMC, EMC-30, No. 3, August) from strict closed-form measuring standards to specifically represent for opened-form design method solutions as new use standards performance interpretation and introduce modified test representation procedures to include definitions of opened-form direct line-of-sight Fresnel zone blocking criteria with diffraction effects comprising of: using the opened-form standard unit of RBF measurement is the decibel or dB, the decibel value is the ratio of two measurements of electromagnetic field ratio of two measurement of electromagnetic field strength taken before and after shielding is in place, using an alternate opened-form standard unit of RBFmag measurement is in magnitude ratio defined as $$RBFmag = 10^{\wedge}(RBF/20),$$

using alternate nomenclatures for RBF device rating the shielding effectiveness, are radiation proof factor (RPF) and radiation shield factor (RSF), using an alternate opened-form standard unit of RPFmag measurement is in magnitude ratio defined as $$RPFmag = 10^{\wedge}(RPF/20),$$

and
using an alternate opened-form standard unit of RSFmag measurement is in magnitude ratio defined as $$RSFmag = 10^{\wedge}(RSF/20),$$

whereby said device rating provide a quality figure-of-merit measure for the invention in either decibel or magnitude units of measurement."

The discussion above describes wearable garments, electronic equipment carrying pouch, fan structures, eyewear articles and screen articles, joined with EMI/RFI material properties that include several variations to allow it operated as an electromagnetic field radiation shielding or blockage device for the predetermined human body tissue part, either predeterminedly worn or placed in close proximity to the user. Although various implementations and variations are discussed above, other variations can be incorporated within the scope of the present invention, as would be appreciated by those skilled in the art. The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A method of radiation shielding device rating in terms of shielding or blockage effectiveness in reducing the energy of radiated electromagnetic fields is referred to as radiation blockage factor RBF having to encompass teachings of the method by which RBF may be estimated is in modifying the transmission line method and circuit method from strict closed-form measuring standards to specifically represent for opened-form design method solutions as new use standards performance interpretation and introduce modified test representation procedures to include definitions of opened-form direct line-of-sight Fresnel zone blocking criteria with diffraction effects comprising of:

using the opened-form standard unit of RBF measurement is the decibel or dB, the decibel value is the ratio of two measurements of electromagnetic field ratio of two measurement of electromagnetic field strength taken before and after shielding is in place, using an alternate opened-form standard unit of RBFmag measurement as is calculated in magnitude ratio, using alternate nomenclatures for RBF device rating the shielding effectiveness, are radiation proof factor RPF and radiation shield factor RSF, using an alternate opened-form standard unit of RPFmag measurement as is calculated in magnitude ratio, and using an alternate opened-form standard unit of RSFmag measurement as is calculated in magnitude ratio, whereby said device rating provide a quality figure-of-merit measure for the invention in either decibel or magnitude units of measurement.

2. The method of radiation shielding device rating according to claim 1, the said rating further comprises of:

using alternate nomenclatures to mean equivalently RBF nomenclature in nature, further including; electromagnetic-field blockage factor EBF, electromagnetic-field proof factor EPF, electromagnetic-field shield factor ESF, cell-phone blockage factor CBF, cell-phone proof factor CPF, cell-phone shield factor CSF, whereby said alternate nomenclatures provide a terminology extension of shield effectiveness rating nomenclature means to provide a relevant quality figure-of-merit measure for the invention.

* * * * *